(12) United States Patent
Boinard et al.

(10) Patent No.: US 8,556,418 B2
(45) Date of Patent: Oct. 15, 2013

(54) CURVED LENSES AND RELATED METHODS

(75) Inventors: Eric Boinard, Dumbarton (GB); Pascal Boinard, Dumbarton (GB)

(73) Assignee: Polaroid Eyeware Ltd, Dundarton (GB)

( * ) Notice: Subject to any disclaimer, the term of this patent is extended or adjusted under 35 U.S.C. 154(b) by 0 days.

(21) Appl. No.: 13/447,363

(22) Filed: Apr. 16, 2012

(65) Prior Publication Data
US 2012/0262669 A1    Oct. 18, 2012

Related U.S. Application Data

(60) Provisional application No. 61/475,901, filed on Apr. 15, 2011.

(51) Int. Cl.
*G02C 7/12* (2006.01)
*G02B 5/30* (2006.01)
*G03F 7/00* (2006.01)

(52) U.S. Cl.
CPC .. *G02C 7/12* (2013.01); *G02B 5/30* (2013.01); *G03F 7/0002* (2013.01)
USPC ..................... 351/159.56; 359/352; 264/1.32; 425/385

(58) Field of Classification Search
USPC ............. 351/159.49, 159.56, 159.6; 359/301, 359/352
See application file for complete search history.

(56) References Cited

U.S. PATENT DOCUMENTS

| | | | |
|---|---|---|---|
| 2,099,694 A | 11/1937 | Land | |
| 2,431,942 A | 12/1947 | Land | |
| 2,454,515 A | 11/1948 | Land | |
| 3,528,722 A | 9/1970 | Makas | |
| 3,647,278 A | 3/1972 | Makas | |
| 3,720,555 A | 3/1973 | Ceppi | |
| 4,199,538 A * | 4/1980 | Wu | ................................ 264/2.3 |
| 4,877,307 A | 10/1989 | Kalmanash | |

(Continued)

FOREIGN PATENT DOCUMENTS

| EP | 0299509 | 1/1989 |
|---|---|---|
| EP | 0505998 | 9/1992 |

(Continued)

OTHER PUBLICATIONS

Bennett, Jean M. & Bennett, Harold E., Handbook of Optics, Section 10: Polarization, 10-1, 10-102, Paragraph 56, Walter G. Driscoll & Villiam Vaughan eds., 1978.

(Continued)

*Primary Examiner* — Scott J Sugarman
*Assistant Examiner* — William R Alexander
(74) *Attorney, Agent, or Firm* — Allen, Dyer et al.

(57) ABSTRACT

Curved lenses and methods for making curved lenses are described. One embodiment of a method of making a curved lens includes curving a lens blank made of a linear polarizer layer laminated together with a plurality of polymeric layers. The lens blank is curved by engendering rotational motion about a rotational axis of a roller having a forming surface thereon and lateral motion of a belt in contact with the forming surface. The lens blank is heated and pressed between the belt and the forming surface at a pressure, the pressure being supplied by tension on the belt. The pressure is maintained for a time sufficient to allow the lens blank to conform to the shape of the forming surface. Methods of the invention may be used to make curved lenses with different polarization properties and curvatures.

28 Claims, 6 Drawing Sheets

(56) References Cited

U.S. PATENT DOCUMENTS

| | | | |
|---|---|---|---|
| 5,061,042 A | 10/1991 | Nakamura et al. | |
| 5,751,481 A * | 5/1998 | Dalzell et al. | 359/485.03 |
| 5,805,336 A | 9/1998 | Dalzell et al. | |
| 5,997,139 A | 12/1999 | Yasuda | |
| 6,177,032 B1 | 1/2001 | Smith et al. | |
| 6,432,327 B2 | 8/2002 | Beeloo et al. | |
| 6,521,146 B1 * | 2/2003 | Mead | 264/2.4 |
| 6,549,335 B1 | 4/2003 | Trapani et al. | |
| 6,554,421 B1 * | 4/2003 | Billard et al. | 351/41 |
| 6,650,473 B2 | 11/2003 | Nakagoshi | |
| 6,801,360 B2 | 10/2004 | Phillips | |
| 6,891,589 B2 | 5/2005 | Hata et al. | |
| 7,088,511 B2 | 8/2006 | Trapani et al. | |
| 7,106,509 B2 | 9/2006 | Sharp | |
| 7,289,257 B1 | 10/2007 | Nakagoshi | |
| 7,339,736 B2 | 3/2008 | Trapani et al. | |
| 7,517,081 B2 | 4/2009 | Lipton | |
| 7,524,053 B2 | 4/2009 | Lipton | |
| 7,852,561 B2 * | 12/2010 | Chiba et al. | 359/489.15 |
| 7,854,506 B1 | 12/2010 | Johnson et al. | |
| 7,946,703 B2 | 5/2011 | Johnson et al. | |
| 8,100,525 B2 | 1/2012 | Johnson et al. | |
| 2001/0038438 A1 | 11/2001 | Beeloo et al. | |
| 2003/0214080 A1 * | 11/2003 | Maki et al. | 264/500 |
| 2004/0227995 A1 | 11/2004 | Gettens | |
| 2005/0018095 A1 | 1/2005 | Kim | |
| 2005/0269020 A1 | 12/2005 | Matsuoka | |
| 2006/0285026 A1 | 12/2006 | Robinson | |
| 2007/0236809 A1 | 10/2007 | Lippey et al. | |
| 2007/0270062 A1 * | 11/2007 | Weber | 442/65 |
| 2009/0053353 A1 * | 2/2009 | Chang | 425/331 |
| 2009/0079934 A1 * | 3/2009 | Su et al. | 351/163 |
| 2009/0097117 A1 * | 4/2009 | Coleman | 359/497 |
| 2009/0165932 A1 * | 7/2009 | Biteau et al. | 156/163 |
| 2009/0205773 A1 | 8/2009 | Nozaki | |
| 2010/0134884 A1 * | 6/2010 | Johnson et al. | 359/487 |
| 2010/0193112 A1 | 8/2010 | Bovet et al. | |
| 2011/0205626 A1 | 8/2011 | Saylor et al. | |

FOREIGN PATENT DOCUMENTS

| | | |
|---|---|---|
| EP | 1217397 | 6/2002 |
| EP | 1826594 | 8/2007 |
| KR | 10-2004-0026032 | 3/2004 |
| KR | 10-2007-0095101 | 9/2007 |
| WO | 9738344 | 10/1997 |
| WO | 9738345 | 10/1997 |
| WO | 2007008777 | 1/2007 |

OTHER PUBLICATIONS

International Search Report for PCT/IB/2012/00749 mailed Oct. 2, 2012.

Request for Ex Parte Reexamination of U.S. Patent 7,854,506 issued Dec. 21, 2010 for Curved lenses Configured to Decode Three-Dimensional Content on Television and Computer Screens, Inventors David A. Johnson, et al.

International Search Report for PCT/IB2012/000752 mailed Oct. 16, 2012.

International Search Report for PCT/IB2012/000750 mailed Oct. 30, 2012.

* cited by examiner

CURVED LENSES AND RELATED METHODS

CROSS-REFERENCE TO RELATED APPLICATION

The application claims priority to U.S. Provisional Application Ser. No. 61/475,901 titled "Apparatus and Method for Shaping Light Polarizers," which was filed on Apr. 15, 2011 and is incorporated herein by reference in its entirety.

FIELD OF THE INVENTION

The invention relates to the field of polarized eyewear, and, more particularly, to curved polarized lenses and eyewear having curved polarized lenses.

BACKGROUND

Light polarizing lenses such as those incorporated into sunglasses or other eyewear are preferably shaped to comply with fashion trends, to minimize the amount of light that can disturb the wearer's peripheral vision and to minimize the appearance of reflections. Unfortunately, there are currently very few techniques that can transform planar polarizing lens blank materials into a curved lens. The techniques that exist may suffer from one or more of the following drawbacks: the lens production process is not adapted for efficient automation, may involve time consuming grinding steps, or may damage the linear polarizer.

SUMMARY

In view of the foregoing, it is an object of the invention to provide curved polarized lenses, which can be produced according to efficiently automated processes that impart minimal or no damage to the delicate linear polarizer material.

According to a method aspect of the invention, a formed lens is prepared from a lens blank made of a linear polarizer layer laminated together with a plurality of polymeric layers, the linear polarizer layer having a polarization axis. Rotational motion is engendered about a rotational axis of a roller having a forming surface thereon and lateral motion is engendered to a belt in contact with the forming surface. The lateral motion is non-parallel to the rotational axis. The lens blank is heated and pressed between the forming surface and belt at a pressure which is maintained for a time sufficient to allow the lens blank to conform to the shape of the forming surface. The pressure is supplied by tension on the belt.

In another method aspect of the invention, a formed lens is prepared from a lens blank made of a linear polarizer layer laminated together with a plurality of polymeric layers, the linear polarizer layer having a polarization axis. The lens blank is placed between a continuously rotating cylindrical roller and a belt. The lens blank is heated to a forming temperature by pressing the lens blank at a pressure between the cylindrical roller and belt wherein the cylindrical roller is at the forming temperature. The pressure is maintained while heating at the forming temperature for allowing the lens blank to conform to the shape of the cylindrical roller. The temperature is reduced while the pressure is maintained for allowing the lens blank to become a rigid lens having a convex side and a concave side. The rigid lens is then removed from between the cylindrical roller and the belt.

In another method aspect of the invention, eyewear is prepared from a first lens and a second lens made of a linear polarizer layer laminated together with a plurality of polymeric layers, the linear polarizer layer having a polarization axis. The first lens and second lens are formed from lens blanks into a desired shape according to the following steps: (i) engendering rotational motion about a rotational axis of a roller having a forming surface thereon and lateral motion of a belt in contact with the forming surface, wherein the lateral motion is non-parallel to the rotational axis; (ii) heating and pressing the lens blanks separately between the belt and the forming surface at a pressure, the pressure being supplied by tension on the belt; and (iii) maintaining the pressure for a time sufficient to allow the lens blank to conform to the shape of the forming surface. The formed first and second lenses are then placed into an eyeglass frame.

The following are preferred forming parameters that may optionally be used in methods of the invention. Heating is preferably conducted at about 70° C. to about 200° C.

In some embodiments, a method may comprise cooling the lens blank while maintaining the pressure. Cooling may be conducted at about 20° C. to about 90° C.

In some embodiments, a method may comprise, heating the lens blank to a temperature of between about 20° C. to about 150° C. prior to placing the lens blank between the cylindrical roller and the flexible belt member and pressing the lens blank.

In certain embodiments, at least one of the polymeric layers is an optical wave retarder having fast and slow axes and the fast retarder axis is aligned at an angle relative to the polarizer axis. The angle may be chosen to render the lens a linear polarizer, an elliptical polarizer, or a circular polarizer.

In embodiments in which the lens is a circular polarizer, an anti-reflective coating may be applied to the concave surface and convex surface of the formed lens. This advantageously allows the formed lens to have a parallel polarizer transmittance equal to or greater than 90% and a cross polarizer transmittance equal to or less than 0.5%.

In some embodiments, the shape of the cylindrical roll member may be adjusted to produce various cylindrically shaped lenses. A cylindrically shaped lens has a first radius of curvature and a second radius of curvature perpendicular to the first radius of curvature, wherein the first radius of curvature is non-zero and second radius of curvature is about zero.

Embodiments of the invention also include eyeglass lenses made according to method aspects of the invention.

These and other objects, aspects, and advantages of the present invention will be better appreciated in view of the drawings and following detailed description of the preferred embodiments.

DETAILED DESCRIPTION OF PREFERRED EMBODIMENTS

In the Summary above and in the Detailed Description of Preferred Embodiments, reference is made to particular features (including method steps) of the invention. It is to be understood that the disclosure of the invention in this specification includes all possible combinations of such particular features. For example, where a particular feature is disclosed in the context of a particular aspect or embodiment of the invention, that feature can also be used, to the extent possible, in combination with and/or in the context of other particular aspects and embodiments of the invention, and in the invention generally.

The term "comprises" is used herein to mean that other features, steps, etc. are optionally present. When reference is made herein to a method comprising two or more defined steps, the steps can be carried in any order or simultaneously (except where the context excludes that possibility), and the method can include one or more steps which are carried out before any of the defined steps, between two of the defined steps, or after all of the defined steps (except where the context excludes that possibility).

This invention may be embodied in many different forms and should not be construed as limited to the embodiments set forth herein.

It is desirable for curved devices that include a light-polarizing layer and that are suitable for application in the manufacture of eyewear to have durability and abrasion resistance appropriate for the application for which they will be used, and manufacturable by a method adapted efficiently to high volume production operations. Ideally, such a device should not lose any of its light-polarizing qualities during the manufacturing process. In addition, curved devices that are suitable for stereoscopic applications should be manufactured by a method that does not degrade their retardation characteristics.

A conventional process for shaping light polarizing lenses uses injection molding. It will be appreciated that injection molding operations are complicated and relatively slow insofar as production operations are concerned. Achieving a desired lens curvature by resorting to methods based upon in-mold polymerization or grinding of each lens individually will likewise be slow and costly.

While the production of curved light-polarizing lenses can be accomplished by individually shaping (molding) blanks from a plastic light-polarizing composite or structure, such as is shown in U.S. Pat. No. 3,560,076 to F. G. Ceppi, the capital investment will be significant.

Embodiments of the invention described here allow for shaping polarizing devices in a range of curvatures without degrading the polarization qualities of the device. It also requires minimum capital investment while delivering high volume manufacturing capability.

Figure 1:
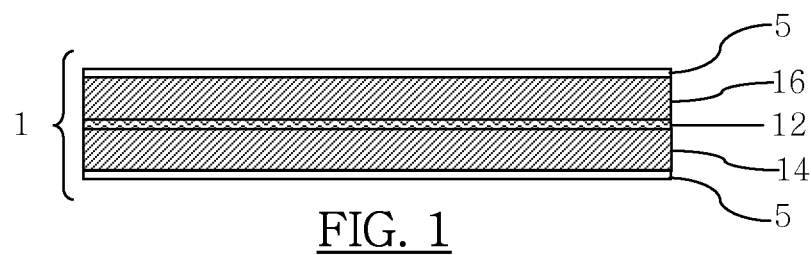
FIG. 1 is a side elevation view of a preferred composite light polarizer sheet that can be used to form a lens in accordance with an embodiment of the invention.
Figure 2:
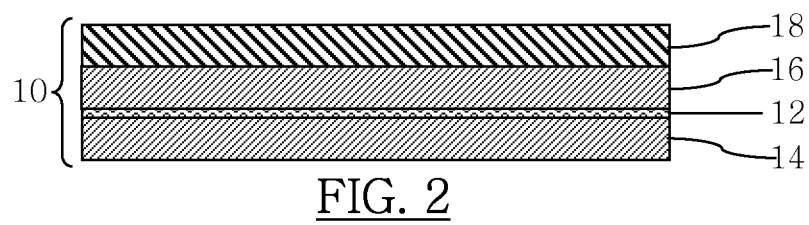
FIG. 2 is a side elevation view of another preferred composite light polarizer sheet that can be used to form a lens in accordance with an embodiment of the invention.
Figure 3:
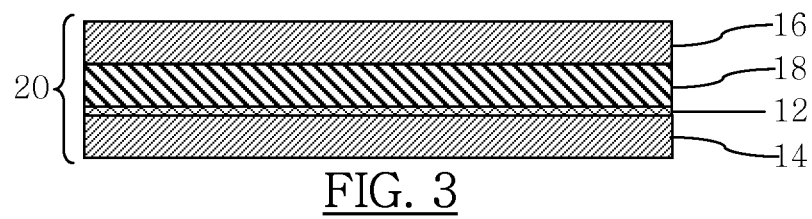
FIG. 3 is a side elevation view of another preferred composite light polarizer sheet that can be used to form a lens in accordance with an embodiment of the invention.

FIGS. 1-3 illustrate exemplary composite light polarizer sheets from which the curved polarized lenses of the invention may be formed. Referring initially to FIG. 1, an exemplary sheet 1 includes a polarizer layer 12 laminated between first and second polymeric layers 14, 16. A protective hardcoat layer 5 is coated on top of both polymeric layers 14, 16. Referring to FIG. 2 another exemplary sheet 10 includes a polarizer layer 12 laminated between first and second polymeric layers 14, 16 and a retarder layer 18 laminated to the second polymeric layer 16. Referring now to FIG. 3, an alternative example of a sheet 20 includes a polarizer layer 12 laminated to a first polymeric layer 14 on one side and to a retarder layer 18 on the other side. A second polymeric layer 16 is laminated to the retarder layer 18 on the side of the retarder layer 18 that is opposite the polarizer layer 12.

The polarizer layer 12 is preferably a linear polarizer, which may be made of any number of suitable linear polarizer materials such as H-type or K-type polarizers. In a preferred example, the polarizer material is made from a linear molecularly oriented dichroic light-polarizing material. Such materials typically have a thickness in the range of about 0.025 to 0.076 mm. A preferred material to serve as the light polarizer is a layer of stretched (oriented) polyvinyl alcohol of about 0.025 mm thickness, which is stained with a dichroic dye such as iodine. Optionally, the polarizer may be borated to improve stability. Polarizers of this type are disclosed in U.S. Reissue Pat. Re. 23,297 and in U.S. Pat. No. 4,166,871.

Alternatively, the polarizer material may be a stretched polyvinyl alcohol (PVA) sheet containing polyvinylene light-polarizing species such as may be provided by typical hydrochloric acid vapor processing. Preferably, such polarizing material will be borated for improved stability. Suitable light-polarizing materials of this type can be prepared according to U.S. Pat. No. 2,445,555. Other light polarizing materials such as those described in U.S. Pat. Nos. 2,237,567; 2,527,400; and 2,554,850 may also be used. Regardless of the type of polarizer material used, the polarizer material may be sandwiched to or between one or more support layers, such as a polymeric material layer 14, 16 to provide mechanical strength to the polarizer layer 12.

The polymeric layers 14, 16 are preferably made from one or more thermoplastic polymers, which are polymers that can be formed to a desired shape by applying temperature and/or pressure. Suitable polymers include, but are not limited to, cellulose derivatives such as cellulose acetate, cellulose diacetate, cellulose triacetate, or cellulose acetate butyrate; acrylate derivatives such as polymethylmethacrylate (PMMA); polycarbonates; polyamides, polyurethanes; polypropylenes; polyethylenes; or cyclo-olefin based polymers or copolymers. The polymeric material layers 14,16 may be made from a single layer of a single polymer, a single layer of a blend of polymers, multiple laminated layers of a single polymer, or multiple laminated layers made of different polymers or a blend of polymers.

It is preferred that the polymeric layers 14, 16 provide durability, mechanical strength, and scratch resistance to the sheet 12 and the finished curved lens made from the sheet 12.

In some cases, it may be beneficial to use polymers that either carry or may be provided with a suitable protective coating such a polymeric hard coating 5 that can withstand the temperatures and pressures used in the forming process. Suitable protective coatings include polyurethanes, polyacrylates, or urea-based resins.

The retarder layer 18 is preferably made from a light transmissive birefringent material such as a cyclo-olefin based polymer or co-polymer. Other suitable materials that can be used to form the retarder layer 18 include, but are not limited to, acrylate based polymer, polypropylenes, polyesters, cellulose acetate based polymers, PVA, polystyrenes, polycarbonates, and norbornene based polymers and co-polymers.

One or more additives may be included in the polarizer layer 12, polymeric layers 14, 16 and/or retarder layer 18. For example, stabilizers, UV absorbers, and colorant dyes may be employed depending on the desired properties of the finished curved optical filter.

Figure 4:
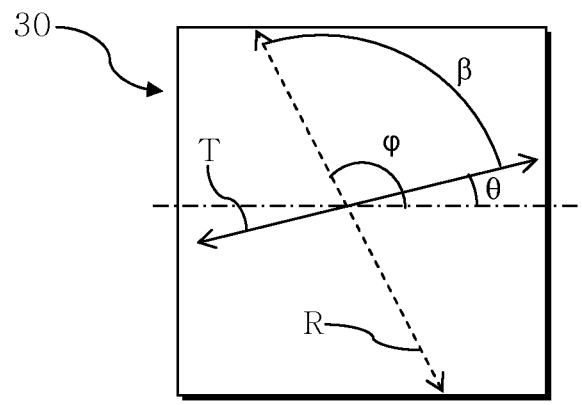
FIG. 4. is a plan view of a preferred composite light polarizer sheet from which a lens blank can be cut, showing the alignment of the transmission axis of the linear polarizer layer and the fast axis of the retarder layer.

The polarizer layer 12 and retarder layer 18 include axes that may be aligned relative to one another to produce a desired polarization effect. Referring to FIG. 4, an exemplary sheet 30 having polarizer layer 12 and a retarder layer 18 is shown. The polarizer layer 12 has a transmission axis T aligned at the angle $\theta$. The fast axis R of the retarder layer 18, is aligned at the angle $\phi=\theta+\beta$ where $\beta$ is the angular offset of the fast axis R of the retarder layer 18 relative to the transmission axis T of the polarizer layer 12. When $\beta=(n-1)(\pi/2)$ with n an integer, the two axes are either parallel or orthogonal to each other and the sheet 30 behaves as a linear polarizer. When $\beta=(2n-1)(\pi/4)$ with n an integer, the sheet 30 behaves as a circular polarizer. For any other values of $\beta$, the sheet 30 behaves as an elliptical polarizer.

In more detail, the linear polarizer layer 12 has a transmission axis T oriented at $\theta$ and defined by the Stoke vector of Eq. (1).

$$\frac{1}{2}\begin{pmatrix} S_0 + S_1 \cdot \cos2\theta + S_2 \cdot \sin2\theta \\ S_0 \cdot \cos2\theta + S_1 \cdot \cos^2 2\theta + S_2 \cdot \sin2\theta\cos2\theta \\ S_0 \cdot \sin2\theta + S_1 \cdot \sin2\theta\cos2\theta + S_2 \cdot \sin^2 2\theta \\ S_3 \end{pmatrix} \quad \text{Eq. (1)}$$

The polarizer comprises a linear polarizer layer 12 with transmission axis T oriented at $\theta$ and a retarder layer with its fast axis R aligned at $\phi$ defined by the Stoke vector of Equation 2.

defines the Stoke vector of light that is transmitted though the sheet 30.

Using these relationships any number of sheets 1, 10, 20, 30 configurations can be formed depending on the desired polarization properties of the sheet 1, 10, 20, 30 and the finished curved lens. In practice one may form a sheet 10, 20, 30 having desired polarization properties by predetermining the desired polarization properties of the sheet 10, 20, 30 and then forming the sheet 10, 20, 30 in such a way that the fast axis R of the retarder layer 18 is aligned at the desired angle relative to the polarization axis T of the polarizer layer 12 to achieve the desired polarization properties.

Figure 5:
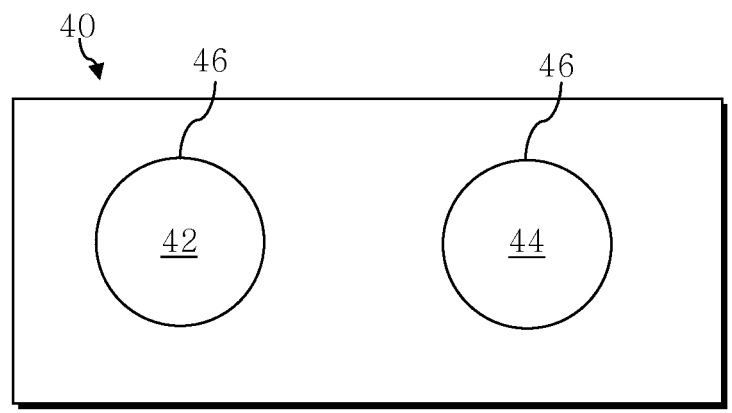
FIG. 5 is a plan view of a section of a composite light polarizer sheet, showing how lens blanks may be cut therefrom.
Figure 6:
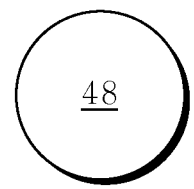
FIG. 6 is a plan view of a lens blank removed from the section of composite light polarizer sheet of FIG. 4.

In preparation for making a curved lens, lens blanks may be prepared by cutting and removing blanks of a size and shape suited for the production of the desired lens from a composite light polarizer sheet of the invention. A preferred method of preparing a blank to be formed into a lens is shown in FIG. 4, which is a plan view of a section of sheet 40 from which blanks 42, 44 are cut and removed. The blanks 42, 44 are prepared by making a cut 46 through the section of sheet 40. The cut 46 defines the perimeter of an individual blank 42, 44 from which a blank 48 can be removed as shown in FIG. 5. Suitable methods of making the cut 46 include the use of a rolling knife cutter, a reciprocal stamping cutter, a straight edge cutting knife, a rotary die, or a laser cutter.

Individual blanks, such as the blank 48 shown in FIG. 5, may be formed into lenses in the manner described below. In certain embodiments, the blanks 48 may be subjected to one or more pre-forming treatments such as cleaning, coating, or polishing if desired.

A method by which a blank 48 of the invention is formed into a lens that is concave on one side and convex on the other side will now be described in connection with FIGS. 7 through 10.

Figure 7:
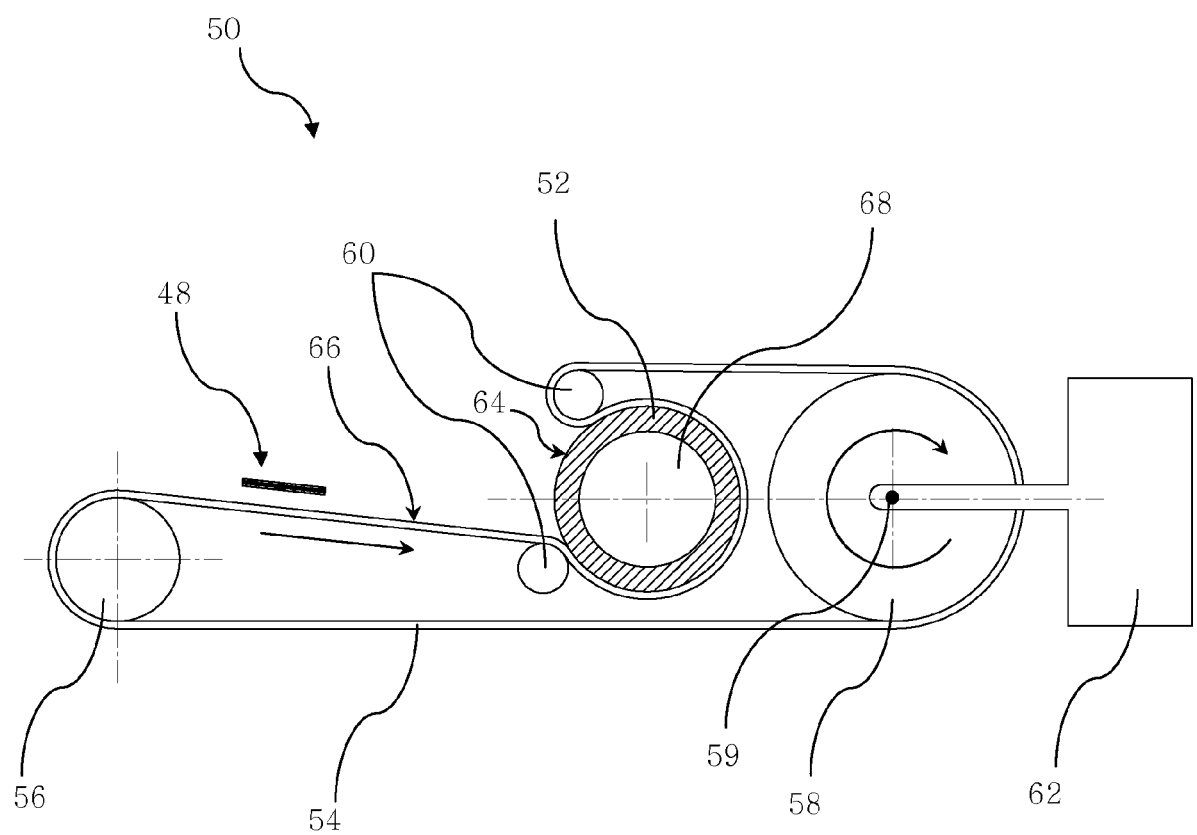
FIG. 7 is a cross-sectional view of an apparatus that can be used to curve lens blanks into lenses according to a method aspect of the invention.

The forming process can be carried out using an apparatus 50 of the type shown in FIG. 7. The apparatus comprises a roller 52, a belt 54, a rotatable member 56, a belt driving member 58, two belt support members 60 and a belt tensioning device 62. The roller 52 has a substantially smooth forming surface 64 at its outer periphery and an inner fluid chamber 68. The belt 54 is preferably flexible and has a substantially smooth surface 66. The belt 54 is supported by the rotatable member 56, belt driving member 58, and the support members 60. The support members 60 are located proximal to the roller 52 and allow the top surface of the belt 54 to maintain contact with the forming surface 64 of the $$\frac{1}{2}\begin{pmatrix} S_0 + \cos2\theta \cdot (S_1\cos^2 2\phi + S_2\cos2\phi\sin2\phi - S_3\sin2\phi) + \sin2\theta \cdot \begin{pmatrix} S_1\cos2\phi\sin2\phi + \\ S_2\sin^2 2\phi + S_3\cos2\phi \end{pmatrix} \\ \cos2\theta \cdot S_0 + \cos^2 2\theta \cdot (S_1\cos^2 2\phi + S_2\cos2\phi\sin2\phi - S_3\sin2\phi) + \sin2\theta\cos2\theta \cdot \begin{pmatrix} S_1\cos2\phi\sin2\phi + \\ S_2\sin^2 2\phi + S_3\cos2\phi \end{pmatrix} \\ \sin2\theta \cdot S_0 + \sin2\theta\cos2\theta \cdot (S_1\cos^2 2\phi + S_2\cos2\phi\sin2\phi - S_3\sin2\phi) + \sin^2 2\theta \cdot \begin{pmatrix} S_1\cos2\phi\sin2\phi + \\ S_2\sin^2 2\phi + S_3\cos2\phi \end{pmatrix} \\ S_1\sin2\phi - S_2\cos2\phi \end{pmatrix} S = \begin{pmatrix} S_0 \\ S_1 \\ S_2 \\ S_3 \end{pmatrix} \quad \text{Eq. (2)}$$

roller 52. Preferably, the belt 54 is under sufficient tension to press firmly against the roller 52.

The pressure exerted by the belt 54 on the roller 52 is regulated by the belt tensioning device 62. In this regard, the belt driving member 58 is attached to the belt tensioning device 62 via a connector 59. When the belt tensioning device 62 is moved closer to the roller 68, the tension on the belt 54 decreases, thereby decreasing the pressure that can be exerted by the belt 54. In contrast, when the belt tensioning device 62 is moved further from the roller 68, the tension on the belt 54 increases, thereby increasing the pressure that can be exerted by the belt 54.

Figure 10:
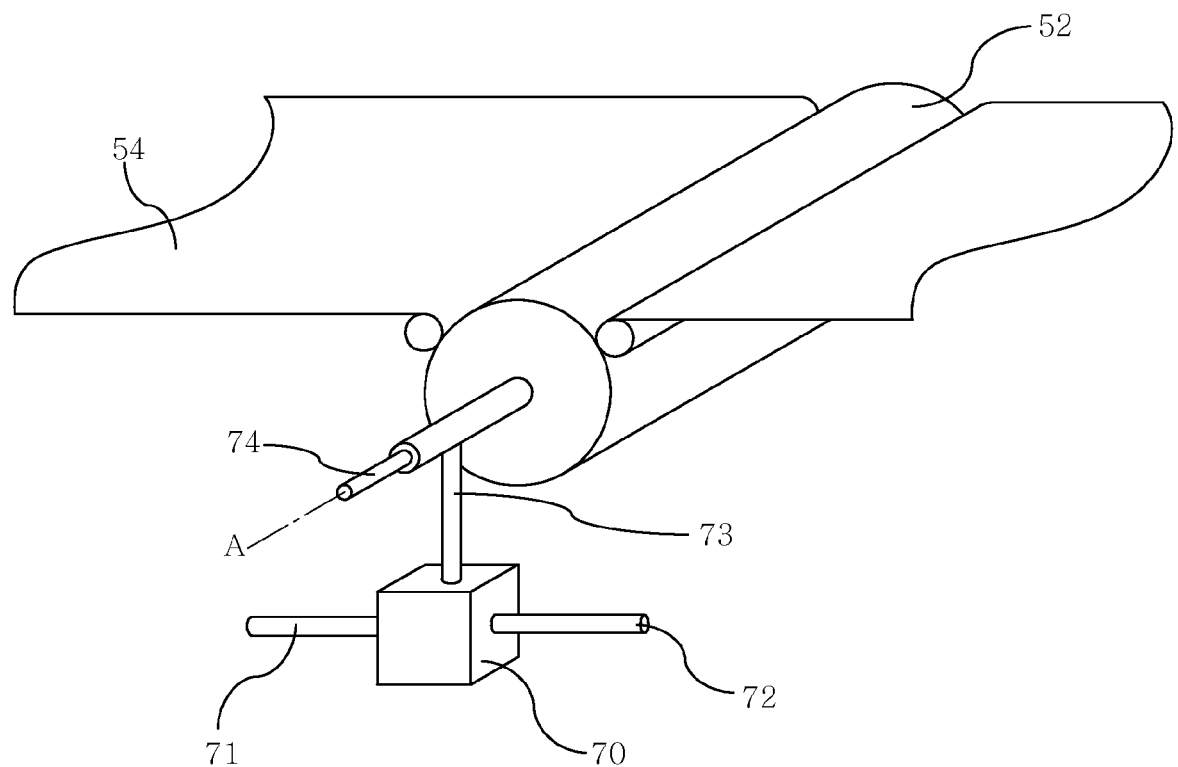
FIG. 10 is a schematic view of the apparatus of FIG. 7, showing the heating and cooling device of the cylindrical roller.

The belt driving member 58 is operably attached to a motor that causes the belt driving member 58 to rotate. The rotation of the belt driving member 58 causes the belt 54 to move. For example, when the belt driving member 58 rotates in the direction indicated by the arrow thereon, the belt 54 moves in the direction indicated. Both the roller 52 and the rotatable member 56 rotate in response to the motion of the belt 54 passing over it. Preferably, the support members 60 also rotate in response to the motion of the belt 54 passing over them. Accordingly, the roller 52, rotatable member 56, belt driving member 58, and support members 60 each have an axis of rotation passing through the center thereof. FIG. 10 shows the axis of rotation A that passes through the roller 52.

The belt 54 is preferably made of, but not limited to, an elastomer, a polymer, or flexible metal film. Preferably, the belt 54 has a thickness between about 0.1 mm and about 5 mm, a tensile strength between about 20 MPa and about 250 MPa and an elongation at break between about 2% and about 60%.

Referring specifically now to FIG. 10, a preferred heating and cooling mechanism for the roller 52 includes a three-way valve 70, a heating fluid conduit 71, a cooling fluid conduit 72, a fluid inlet 73, and a fluid outlet 74.

Figure 8:
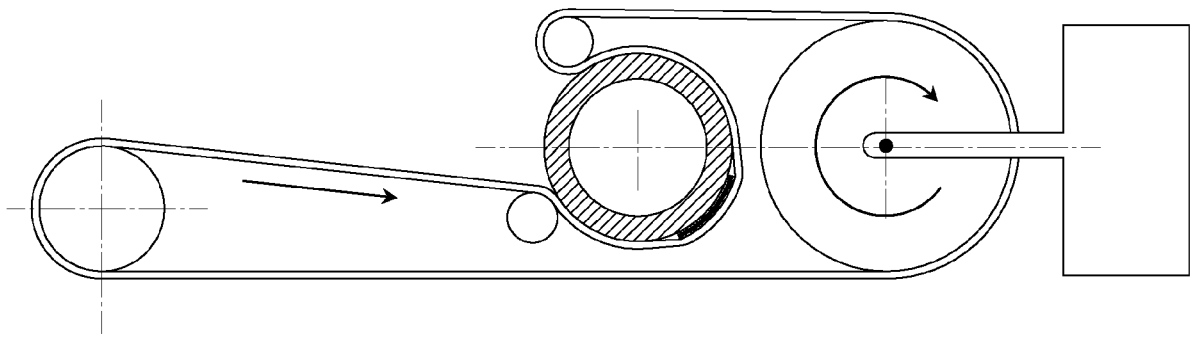
FIG. 8 is a cross-sectional view of the apparatus of FIG. 7 during a pressure application stage of a method aspect of the invention.

The method by which a blank 48 of the invention is formed into a lens that is concave on one side and convex on the other side is initiated by placing the blank 48 on the belt surface 66. By activating the belt driving member 58, the blank 48 is carried by the belt 54 until it is pressed between the belt surface 66 and the roller forming surface 64 as shown in FIG. 8. In a preferred embodiment, the roller 52 and belt 54 are continuously rotated at a speed of about 0.1 and about 10 meters/minute.

The roller 52 is heated by passing hot fluid through the fluid chamber 68. The forming surface 64 is heated at temperature sufficient to cause deformation of the lens blank 48 material and for the lens blank 48 to conform to the forming surface 64.

In the production of a curved lens of the invention, it may be desirable to utilize a cylindrically shaped roller 52 having a forming surface 64 corresponding to a predetermined curvature of the concave surface of the lens to be formed, which may serve as the inner surface of an eyeglass lens. A suitable radius of curvature for the forming surface 64 for forming a concave lens surface is about 50 mm to about 270 mm, or about 65 mm to about 90 mm. In a particular embodiment, the radius of curvature is about 87.2 mm.

The temperature sufficient to cause the blank 48 to deform may vary with the chemical composition of the blank's 48 composite structure. A preferred heating temperature range is between about 70° C. to about 200° C. Another preferred heating temperature range is between about 90° C. to about 110° C. One particular preferred heating temperature is about 105° C.

In some cases it may be helpful to pre-heat the blank 48 before placing it on the belt 54. Suitable pre-heating temperatures are within the range of about 20° C. to about 150° C.

The temperature of the forming surface 64 of the roller 52 can be controlled by the passage of heated fluid and cooled fluid, as described previously. The roller 52 is preferably preheated, prior to placement of the lens blank 48 between the roller 52 and belt 54, to the desired forming temperature for a heating cycle sufficient to provide the desired shaped lens. The desired forming temperature is maintained for a duration sufficient to affect desired lens formation. Although not limiting, a suitable duration is between about 30 seconds to about 180 seconds. Thereafter, the temperature of the forming surface 64 is reduced by passing a cooling fluid, through the fluid chamber 68 of the roller 52. The cooling fluid is passed through the roller 52 for a time sufficient to cool the formed lens. Although not limiting, a suitable cooling duration is about 20 seconds to about 120 seconds. Cooling temperatures from about 20° C. to about 35° C. provide good results, but other cooling temperatures are also contemplated.

Hot fluid is supplied to the roller 52 through the heating fluid conduit 71 and the relatively cool fluid is supplied through the cooling fluid conduit 72. During the heating cycle, the valve 70 opens a connecting passage between the heating fluid conduit 71 and the inlet 73 and closes the cooling fluid conduit 72. During the cooling cycle, the valve 70 opens a connecting passage between the cooling fluid conduit 72 and the inlet 73 and closes the heating fluid conduit 71. The transition from the heating cycle to the cooling cycle is carried out by operating valve 70 to mix cool fluid with the hot fluid until the hot fluid is completely displaced by cool fluid. Transition from the cooling cycle to heating cycle is carried out by reversing the operation.

Figure 9:
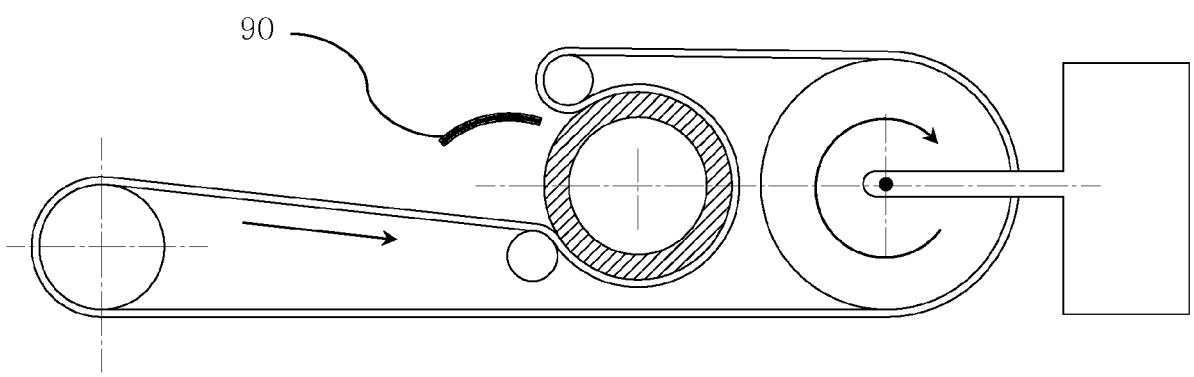
FIG. 9 is a cross-sectional view of the apparatus of FIG. 7, showing a curved lens removed from the apparatus.

After the cooling operation, the formed lens 90 exits from between the roller 52 and the belt 54 and is removed, as shown in FIG. 9. If the formed lens 90 adheres to the roller 52, it may be removed by applying a stream of compressed air.

One or more coatings can be applied on the concave and/or convex surfaces of the formed lens 90 using conventional vacuum deposition techniques. The inventors discovered that applying an anti-reflective coating to the convex and concave surfaces of a circular polarizer lens of the invention can significantly improve the transmittance % of the finished circular polarizer lens.

The method described above can also include repeating each of these steps using a series of rollers 52 for the shaping of blanks 48 to each of a series of concave lens surfaces, each of such surfaces having a different curvatures within a desired range of curvatures, thus providing a series of lenses, each having a different concave surface within a desired range of curvatures.

A lens of the invention may also gradually be shaped to a desired form by repeating the steps and gradually increasing the curvature of the roller 52 prior to each repetition. This can be accomplished using a series of cylindrical rollers 52 with each set in the series having an increased curvature relative to the prior set.

The shape of a formed lens of the invention will substantially correspond to the shape of the forming surfaces 64. Accordingly, different shaped forming surfaces 64 can be used to form lenses with different curvatures.

For cylindrically curved lenses, the shape of the lens, along the first principal meridian corresponds substantially to the relationship $r1=(n-1)/D$, the shape of the lens along the second principal meridian, perpendicular to the first principal meridian, is substantially equal to zero ($r2=0$), n is the index of refraction of blank 48, D is the intended curve of the lens, r1 and r2 are the radii of curvature of each principal meridian of the forming surface 64. In preferred embodiments, r1 is typically in the range of about 1 to about 10 diopters and the lens thickness is typically in the range of about 0.2 mm to about 2.5 mm.

Figure 11:
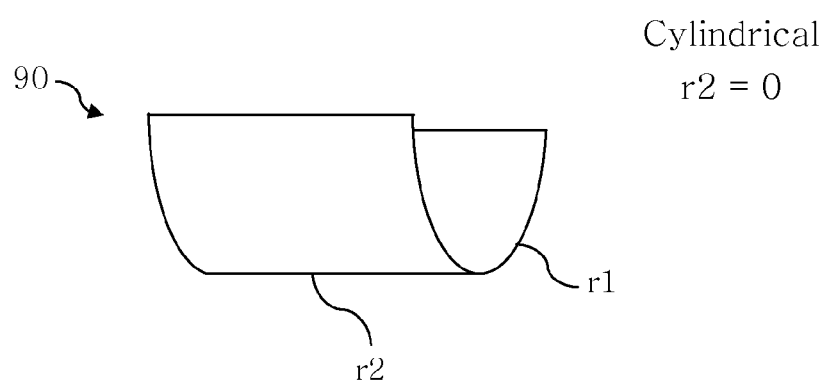
FIG. 11 is a schematic of cylindrically shaped lens made according to a method aspect of the invention.

FIG. 11 depicts a formed cylindrical lens 90. The curvature of the lens 90 is characterized by a first radius of curvature r1 and a second radius of curvature r2. The lines along which r1 and r2 are determined are indicated. For a cylindrically curved lens 90, r2 is about 0 diopter.

Figure 12:
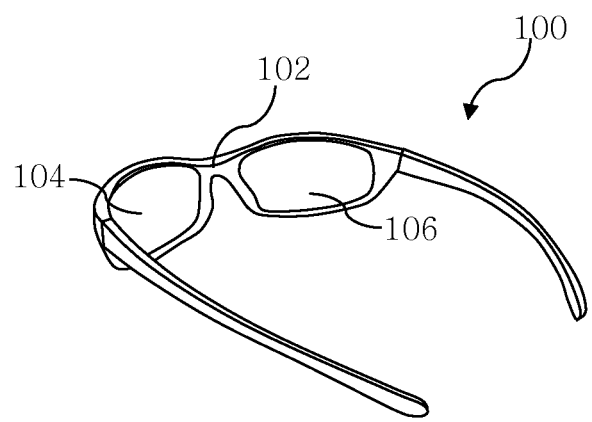
FIG. 12 is a perspective view of eyeglasses incorporating lenses of the invention.

Another object of the invention is to provide polarized eyewear that includes two lenses of the invention. Referring to FIG. 12, the eyewear 100 includes an eyeglass frame 102, a first lens 104 and a second lens 106. The lenses 104, 106 may be the same or different, depending on the desired use of the eyewear. For the manufacture of linear polarized eyewear, the first lens 104 and second lens 106 are identical. The sheet used for these lenses will have a stoke vector as described in Equation 1 with the polarizer axis orientated parallel to the horizontal ($\theta=0$). In some preferred examples for stereoscopic use, both lenses are made of linear polarizer sheet having a stoke vector as described in Equation 1 with the polarizer axis of the first lens 104 orientated at $\theta$ and the polarizer axis of the second lens 106 orientated at $\theta+\pi/2$. In a further preferred example for stereoscopic use, the sheet material comprises a retarder layer 18 and has a Stoke vector as described in Equation 2. The first lens 104 has its polarizer axis T orientated at $\theta$ and fast axis of the retarder R orientated at $\phi=\theta+\beta$ and the second lens 106 has its polarizer axis T orientated at $\theta$ and fast axis of the retarder R orientated at $\phi=\theta-\beta$.

EXAMPLES

In this section, certain illustrative embodiments of the invention are described. These are provided by way of example only and, therefore, do not limit the scope of the invention.

Example 1

Preparation of a Lens of the Invention

Figure 13:
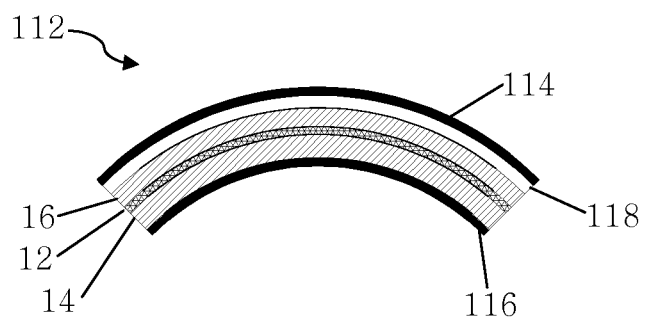
FIG. 13 is a cutaway view of a curved lens including a hard coating in accordance with an embodiment of the invention.

A cylindrically shaped linear polarizer lens of the invention was prepared using the method and apparatus described above. The structure of the lens 112 will be better understood by referring to FIG. 13. The lens 112 was formed from a total of six layers of material including a polarizer layer 12, a first polymeric layer 14, a second polymeric layer 16, a third polymeric layer 118, a first hard coat layer 114 and a second hard coat layer 116. The materials used to make the lens 112, the properties of the cylindrical roller and belt, and the forming parameters are all specified in TABLE 1.

TABLE 1

Materials and Parameters Used to Form an Exemplary Lens of the Invention

| | | |
|---|---|---|
| Lens Materials | Layer 1 (114) | hardcoat |
| | Layer 2 (118) | cellulose triacetate |
| | Layer 3 (16) | cellulose triacetate |
| | Layer 4 (12) | stretched PVA with iodine |
| | Layer 5 (14) | cellulose triacetate |
| | Layer 6 (116) | hardcoat |
| | Thickness of blank material | 0.8 mm |
| roller (cylindrically shaped) | Material | steel |
| | Radius (r1) | 87.2 mm |
| Belt | Material | Hardcoated polycarbonate |

TABLE 1-continued

Materials and Parameters Used to Form an Exemplary Lens of the Invention

| | | | |
|---|---|---|---|
| Forming Parameters | Temperatures | pre-heating | 50-70° C. |
| | | heating | 90-100° C. |
| | | cooling | 20-35° C. |
| Rotation speed | | | 0.25 m/min |

Example 2

Figure 14:
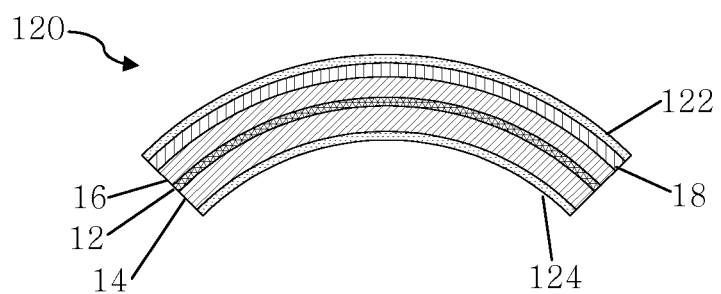
FIG. 14 is a cutaway view of a curved lens including an anti-reflective coating in accordance with an embodiment of the invention.

Improvement of Transmittance using Anti-Reflective Coatings on Circular Polarized Lenses Circular polarizer lenses of the invention were coated on both the convex and concave surfaces with an anti-reflective coating in order to determine whether an anti-reflective coating can improve the transmittance % within the wavelength range of 280 to 700 nm, which includes the visible light spectrum. The structure of a circular polarized lens including an antireflective coating will be better understood with reference to FIG. 14 in which the lens 120 includes a polarizer layer 12, a first polymeric layer 14, a second polymeric layer 16, a retarder layer 18, a first antireflective coating layer 122 and a second antireflective coating layer 124.

TABLE 2 shows results of typical transmittance % improvement.

TABLE 2

Transmittance Improvement Data

| Anti-reflective coating applied? | Cross polarizer transmittance (%) | Parallel polarizer transmittance (%) |
|---|---|---|
| NO | 0.02 | 82 |
| YES | 0.03 | 90 |

The application of an anti-reflective coating is used regularly in eyewear products. For both sunglass and corrective eyewear it is applied to the back of the lens to minimize disturbing back reflections on the lens from light sources situated behind the wearer. For corrective eyewear, it is also applied at the front of the lens for cosmetic reasons, namely, in order to prevent reflections from the front of the lenses, making the eyewear less noticeable.

We found that when anti-reflective coatings are applied to stereoscopic eyewear as described in this example, the coating advantageously and significantly increases the transmittance of the light the lens is designed to transmit without increasing the transmittance of the light the lens is designed to block. In this case, the lenses were designed to maximize the parallel polarizer transmittance, while minimizing the cross-polarizer transmittance. The results show that the anti-reflective coating allowed us to increase by the parallel polarizer transmittance by 8% with minimal increase in the cross-polarizer transmittance. This is especially important to 3D projection operators, such as cinema operators, since a significant amount of light is lost in the 3D display. The ability of the eyewear to transmit more light allows the operators to use less powerful light sources resulting in significant operational cost savings.

The present invention has been described hereinabove with reference to the accompanying drawings, in which preferred embodiments of the invention are shown. Unless otherwise defined, all technical and scientific terms used herein are intended to have the same meaning as commonly understood in the art to which this invention pertains and at the time of its filing. Although various methods and materials similar or equivalent to those described herein can be used in the practice or testing of the present invention, suitable methods and materials are described. The skilled should understand that the methods and materials used and described are examples and may not be the only ones suitable for use in the invention.

Accordingly, this invention may be embodied in many different forms and should not be construed as limited to the illustrated embodiments set forth herein. The invention has been described in some detail, but it will be apparent that various modifications and changes can be made within the spirit and scope of the invention as described in the foregoing specification and as defined in the appended claims.

That which is claimed is:

1. A method of making a formed lens, the method comprising:
    obtaining a lens blank comprising, in superposed relation, a linear polarizer layer laminated together with a plurality of polymeric layers, the linear polarizer layer having a polarization axis;
    engendering rotational motion about a rotational axis of a roller having a forming surface thereon and lateral motion of a belt in contact with the forming surface, wherein the lateral motion is non-parallel to the rotational axis;
    heating and pressing the lens blank between the belt and the forming surface at a pressure, the pressure being supplied by tension on the belt; and
    maintaining the pressure for a time sufficient to allow the lens blank to conform to the shape of the forming surface.

2. The method of claim 1, wherein heating is conducted at about 70° C. to about 200° C.

3. The method of claim 1, further comprising cooling the lens blank while maintaining the pressure.

4. The method of claim 3, wherein cooling is conducted at about 20° C. to about 90° C.

5. The method of claim 1, further comprising, preheating the lens blank to a temperature of about 20° C. to about 150° C. prior to pressing.

6. The method of claim 1, wherein the lateral motion is at a speed of about 0.1 meters/minute to about 10 meters/minute and pressing is achieved during lateral motion.

7. The method of claim 1, wherein at least one of the polymeric layers is an optical wave retarder having a fast axis and the fast axis is aligned at an angle relative to the polarizer axis.

8. The method of claim 7, wherein the angle renders the lens a linear polarizer.

9. The method of claim 7, wherein the angle renders the lens an elliptical polarizer.

10. The method of claim 7, wherein the angle renders the lens a circular polarizer.

11. The method of claim 10, further comprising coating a concave surface and a convex surface of the formed lens with an anti-reflective coating.

12. The method of claim 11, wherein the formed lens has a parallel polarizer transmittance equal to or greater than 90% and a cross polarizer transmittance equal to or less than 0.5%.

13. The method of claim 1, wherein the shape of the roller produces a cylindrically shaped lens having a first radius of curvature and a second radius of curvature perpendicular to the first radius of curvature, wherein the first radius of curvature is non-zero and the second radius of curvature is zero.

14. An eyeglass lens made according to the method of claim 1.

15. A method of making a formed lens, the method comprising:
    obtaining a lens blank comprising, in superposed relation, a linear polarizer layer laminated together with a plurality of polymeric layers, the linear polarizer layer having a polarization axis;
    placing the lens blank between a continuously rotating cylindrical roller and a belt;
    heating the lens blank to a forming temperature by pressing the lens blank at a pressure between the cylindrical roller and belt, the cylindrical roller being at the forming temperature;
    maintaining the pressure while heating at the forming temperature for allowing the lens blank to conform to the shape of the cylindrical roller;
    reducing the temperature to a reduced temperature while maintaining the pressure for allowing the lens blank to become a rigid lens having a convex side and a concave side; and
    removing the rigid lens from between the cylindrical roller and belt.

16. The method of claim 15, wherein the roller and belt are in continuous rotation at a speed of about 0.1 meters/minute and about 10 meters/minute.

17. The method of claim 15, wherein the forming temperature is about 70° C. to about 200° C.

18. The method of claim 15, wherein the reduced temperature is about 20° C. to about 90° C.

19. The method of claim 15, further comprising, preheating the lens blank to a temperature of about 20° C. to about 150° C. prior to applying the pressure.

20. The method of claim 15, wherein at least one of the polymeric layers is an optical wave retarder having a fast axis and the fast axis is aligned at an angle relative to the polarizer axis.

21. The method of claim 20, wherein the angle renders the lens a linear polarizer.

22. The method of claim 20, wherein the angle renders the lens an elliptical polarizer.

23. The method of claim 20, wherein the angle renders the lens a circular polarizer.

24. The method of claim 23, further comprising coating a concave surface and a convex surface of the formed lens with an anti-reflective coating.

25. The method of claim 24, wherein the formed lens has a parallel polarizer transmittance equal to or greater than 90% and a cross polarizer transmittance equal to or less than 0.5%.

26. The method of claim 15, wherein the shape of the roller produces a cylindrically shaped lens having a first radius of curvature and a second radius of curvature perpendicular to the first radius of curvature, wherein the first radius of curvature is non-zero and the second radius of curvature is zero.

27. An eyeglass lens made according to the method of claim 15.

28. A method of making eyewear, the method comprising:
    (a) obtaining a first lens and a second lens, the first lens and second lens comprising, in superposed relation, a linear polarizer layer laminated together with a plurality of polymeric layers, the linear polarizer layer having a polarization axis, the first lens and second lens being formed from lens blanks into a desired shape according to the following steps:
        (i) engendering rotational motion about a rotational axis of a roller having a forming surface thereon and lateral motion of a belt in contact with the forming surface, wherein the lateral motion is non-parallel to the rotational axis;

(ii) heating and pressing the lens blanks separately between the belt and the forming surface at a pressure, the pressure being supplied by tension on the belt member;

(iii) maintaining the pressure for a time sufficient to allow the lens blank to conform to the shape of the roller; and (b) placing the first lens and second lens into an eyeglass frame.

* * * * *